United States Patent
Olson et al.

(10) Patent No.: US 6,448,186 B1
(45) Date of Patent: Sep. 10, 2002

(54) METHOD AND APPARATUS FOR USE OF HYDROGEN AND SILANES IN PLASMA

(75) Inventors: Darin S. Olson, Menlo Park; Tirunelveli S. Ravi, San Jose; Richard S. Swope, San Francisco; Jerrod Paul Krebs, Fremont, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 61 days.

(21) Appl. No.: 09/684,571

(22) Filed: Oct. 6, 2000

(51) Int. Cl.[7] .............................................. H01L 21/469
(52) U.S. Cl. ...................... 438/758; 438/745; 427/492; 427/377; 257/759
(58) Field of Search ................................ 438/758, 725, 438/745, 542; 427/255.6, 492, 493, 126.2, 96, 377, 387; 257/759

(56) References Cited

U.S. PATENT DOCUMENTS

| | | | |
|---|---|---|---|
| 5,000,113 A | | 3/1991 | Wang et al. |
| 5,310,583 A | * | 5/1994 | Eckstein et al. ............ 427/575 |
| 5,354,715 A | | 10/1994 | Wang et al. |
| 5,362,526 A | | 11/1994 | Wang et al. |
| 5,736,423 A | | 4/1998 | Ngo |
| 5,807,785 A | | 9/1998 | Ravi |
| 5,986,329 A | | 11/1999 | Ngo |
| 6,001,747 A | | 12/1999 | Annapragada |
| 6,051,321 A | | 4/2000 | Lee et al. |
| 6,054,379 A | | 4/2000 | Yau et al. |
| 6,124,641 A | * | 9/2000 | Matsuura ..................... 257/759 |
| 6,225,238 B1 | * | 5/2001 | Wu ............................ 438/778 |
| 6,258,735 B1 | * | 7/2001 | Xia et al. .................... 438/778 |
| 6,303,047 B1 | * | 10/2001 | Aronowitz et al. ............ 252/1 |
| 6,303,523 B2 | * | 10/2001 | Cheung et al. ............. 438/780 |
| 6,331,494 B1 | * | 12/2001 | Olson et al. ................ 438/770 |

* cited by examiner

*Primary Examiner*—Caridad Everhart
(74) *Attorney, Agent, or Firm*—Thomas Swenson, Esq.; Lathrop & Gage, L.C.

(57) ABSTRACT

A hydrogen-containing chemical species is included in the reactant gas mixture in a plasma-enhanced CVD process for forming a carbon-containing dielectric film. The CVD reactant gas mixture contains silicon, oxygen, hydrogen and carbon atoms for forming a novel carbon-containing silicon oxide film in which both Si—C and Si—H bonds are present. Because dielectric material deposited in accordance with the invention has a significant number of Si—H bonds, which are more robust than Si—C bonds, it is more resistant to undesired etching and other physical changes during fabrication than dielectric material formed by conventional methods. A method in accordance with the invention allows a faster deposition rate. A dielectric film formed in accordance with the invention has enhanced uniformity characteristics and a dielectric constant less than 3.

72 Claims, 4 Drawing Sheets

METHOD AND APPARATUS FOR USE OF HYDROGEN AND SILANES IN PLASMA

BACKGROUND OF THE INVENTION

1. Field of the Invention

The invention relates to a method and precursors for forming low dielectric constant insulator material in integrated circuits.

2. Statement of the Problem

As semiconductor technology advances, circuit elements and interconnections on wafers or silicon substrates become increasingly more dense. As a result of the continuing trend toward higher device densities, parasitic interdevice currents are increasingly problematic. In order to prevent unwanted interactions between these circuit elements, insulator-filled gaps, or trenches, located between active circuit devices and metallized interconnect layers are provided to physically and electrically isolate the elements and conductive lines.

For example, in metal-oxide-semiconductor ("MOS") technology, it is necessary to provide an isolation structure that prevents parasitic channel formation between adjacent devices, such devices being primarily NMOS and PMOS transistors or CMOS circuits. Trench isolation technology has been developed in part to satisfy such insulation needs. The trenches are subsequently refilled with a dielectric, such as silicon dioxide, typically by a chemical vapor deposition ("CVD") technique.

Similar isolation techniques are used to separate closely spaced circuit elements that have been formed on or above a semiconductor substrate during integrated circuit fabrication. The circuit elements may be active devices or conductors, and are isolated from each other by refilled "gaps".

The capacitance across a gap is governed by the formula $$C = \in_r kA/t,$$

where C is the capacitance, $\in_r$ is the relative dielectric constant of the gap fill material, k is a constant, A is the area of the gap (i.e., the area of the side of the circuit element forming the gap), and t is the thickness or width of the gap. As gap widths decrease with increasing density, the capacitance across the dielectric gap fill material increases. Thus, as integrated circuits become increasingly dense, decreasing t, it is necessary to lower the dielectric constant of the gap fill material to reduce cross-talk, capacitive coupling and resulting speed degradation, and power consumption. To compensate for smaller gap dimensions, it is known to substitute dielectric materials having dielectric constants lower than silicon dioxide.

In damascene process techniques, the dielectric material is deposited as a blanket, either without or with minimal gap-fill requirements. Trenches or vias are then etched in this material, and these are filled with conductor material. Although the dielectric material is deposited first, and conductive material is used to fill the gaps, the need for a low dielectric blanket material between circuit elements is similar to the described requirement for a low-dielectric constant gap-fill material.

In addition to filling gaps, or trenches, between active devices or local interconnects, there is also a need for a low-dielectric constant insulator material for use as interlayer dielectric ("ILD") and other insulating layers in integrated circuit devices. Thus, there is a need for a method of depositing insulating material having a relative dielectric constant, $\in_r$ of 3.0 or less.

It is known that carbon-containing silicon oxide films have lower dielectric constants than silicon oxide films. It is believed that the carbon works by decreasing the effective density of the film, since a film of zero density, that is, a vacuum, has a dielectric constant of 1. Also, carbon contained in silicon oxide films, for example, in $CH_3$ groups, is usually less polarizable than silicon oxide, thereby lowering the capacitance, or dielectric constant, of the thin film. It is, therefore, known in the art to deposit a carbon-containing silicon oxide film by reacting an organic carbon-containing gaseous precursor compound and a silicon-containing gaseous precursor compound in a PECVD or HDP-CVD process. Typically, a single type of precursor compound contains both silicon and an organic carbon-containing group. For example, it is known to react a gaseous organo silane, such as a methyl silane, in the presence of nitrous oxide in a PECVD process to form a carbon-containing silicon oxide dielectric film. Whereas PECVD $SiO_2$ typically has a measured $\in_r$ of 4.0–4.2, $SiO_2$ doped with carbon can have a reduced her of less than 3.0. The economic feasibility of a PECVD process is determined by, among other factors, the deposition rate. Carbon-containing a $SiO_2$ films have deposition rates that increase as a function of increasing high-frequency radio frequency ("hf rf") power, and as a function of increasing nitrous oxide, $N_2O$, flow. Increasing hf rf power, however, has a detrimental effect on wafer uniformity, and increasing nitrous oxide flow reduces the amount of carbon in the film, thereby increasing the dielectric constant, $\in_r$.

Design feature widths of integrated circuit devices are currently approaching 0.25 μm, or 250 nm. To achieve corresponding overall circuit density, gap dimensions of approximately 100 nm to 400 nm gap width range and 300 nm to 1000 nm gap depth range are desired, having a corresponding range of aspect ratios of 2 to 6. A gap opening of 500 nm or less is too small for depositing material using conventional CVD and PECVD methods. Currently, high density plasma ("HDP") CVD is used to fill high aspect ratio gaps. Also, using HDP-CVD, it is usually possible to deposit silicon oxide films at lower temperatures (e.g., 150° C. to 250° C.) than in a PECVD process. It is known that the addition of carbon to a $SiO_2$ dielectric film formed by an HDP-CVD process also lowers the dielectric constant of the dielectric material. HDP-CVD processes typically use a gas mixture containing oxygen, silane, and inert gases, such as argon. In an HDP process, an rf bias is applied to a wafer substrate in a reaction chamber. Some of the gas molecules, particularly argon, are ionized in the plasma and accelerate toward the wafer surface when the rf bias is applied to the substrate. Material is thereby sputtered when the ions strike the surface, resulting in simultaneous deposition and etching of the dielectric film. This simultaneous deposition and etching is a problem because silicon-carbon bonds, for example, Si—$CH_3$ bonds, are less robust than Si—O bonds of silicon oxide. The undesired result is that carbon is preferentially etched from the deposited dielectric film, causing the dielectric constant of the final film to be higher.

Solution

In a method in accordance with the invention, the reactant gas mixture in a plasma-enhanced CVD process includes a hydrogen-containing chemical species for forming Si—H bonds in a novel carbon-containing silicon oxide film in which both Si—C and Si—H bonds are present. Typically, the CVD reactant gas mixture contains silicon, oxygen, hydrogen and carbon atoms. Because dielectric material deposited in accordance with the invention has a significant number of Si—H bonds, which are more robust than Si—C bonds, it is more resistant to undesired etching, oxidation and other physical changes during fabrication than dielectric material formed by conventional methods. A dielectric film formed in accordance with the invention typically has a dielectric constant less than 3. The invention provides a novel method for rapidly depositing in an integrated circuit a novel, low dielectric constant film having enhanced uniformity characteristics. The dielectric film in accordance with the invention may be viewed as a silicon oxide film having Si—C and Si—H bonds, as well as Si—O bonds.

The invention may be used to deposit a premetal dielectric layer ("PMD"), an intermetal dielectric layer ("IMD"), an interlayer dielectric layer ("ILD"), a passivation layer and other insulator films requiring a low dielectric constant in an integrated circuit. The invention is most useful when applied to deposit a thin film of low dielectric constant material in a gap, or trench, between active devices or conductive interconnects in high density integrated circuits. It is also useful, however, in damascene process techniques.

A method for forming a dielectric film in accordance with the invention comprises steps of: providing a reactant gas mixture in a reaction chamber, the reactant gas mixture containing silicon, oxygen, carbon, and hydrogen atoms; and reacting the reactant gas mixture in the reaction chamber to deposit dielectric material on the substrate. In a first general embodiment, the reactant gas mixture comprises a carbon-containing precursor compound and a hydrogen-containing precursor compound. Usually, the carbon-containing precursor compound and the hydrogen-containing precursor compound are not identical. Preferably, the hydrogen-containing precursor compound contains no carbon atom. Typically, the hydrogen-containing compound is silane, having a stoichiometric formula $SiH_4$. Typically, the carbon-containing precursor compound is an alkyl silane, such as trimethyl silane and tetramethyl silane. Preferably, the reactant gas mixture comprises $SiH_4$ and an alkyl silane.

In a second general embodiment, the reactant gas mixture comprises a carbon-containing precursor compound and a hydrogenating gas. Typically, the hydrogenating gas is hydrogen-gas, $H_2$. Typically, the carbon-containing precursor compound contains an alkyl group. In a particular variation of the embodiment, the carbon-containing precursor compound comprises a silicon atom, an oxygen atom, and a carbon atom, the oxygen atom being chemically bonded to the silicon atom. For example, the carbon-containing precursor compound may be octamethylcyclotetrasiloxane, corresponding to the stoichiometric formula $(SiO(CH_3)_2)_4$.

Preferably, a method in accordance with the invention includes using a plasma-enhanced CVD technique to form a dielectric film on a substrate. A plasma-enhanced CVD technique in accordance with the invention may be plasma-enhanced CVD ("PECVD") or high-density plasma CVD ("HDP-CVD"). Therefore, the reactant gas mixture in the CVD reaction chamber preferably comprises an inert plasma forming gas, such as argon. The reactant gas mixture may also comprise an inert carrier gas. The reactant gas mixture may also typically comprise organic solvent molecules. In PECVD, a high-frequency ("HF") radio frequency ("rf") is applied to the reactant gas mixture to form the plasma. In HDP-CVD, a low-frequency ("LF") rf is applied to the reactant gas mixture, and a HF rf is applied to the substrate wafer. PECVD may be used to deposit carbon-containing silicon oxide films in many applications, but usually not in so-called shallow trench isolation ("STI") or other aggressive gap fill applications, in which closely spaced, narrow gaps (trenches) are filled with low dielectric constant material. A method employing HDP-CVD is especially useful to fill isolator gaps having a gap width in the range of from 50 nm to 1000 nm and an aspect ratio in the range of from 1 to 3 or greater.

DETAILED DESCRIPTION OF THE PREFERRED EMBODIMENT

1. Overview

It should be understood that FIGS. 1, 2, 5–7, depicting integrated circuit devices fabricated in accordance with the invention, are not meant to be actual plan or cross-sectional views of any particular portions of actual integrated circuit devices. In actual devices, the layers will not be as regular and the thicknesses and widths may have different proportions. The various layers in actual devices often are curved and possess overlapping edges. Furthermore, the types and structures of circuit elements in actual integrated circuits that may be electrically isolated using a method and a dielectric film in accordance with the invention are varied and numerous. The figures, therefore, merely show idealized representations that are employed to depict more clearly and fully the use of the invention than would otherwise be possible.

Figure 1:
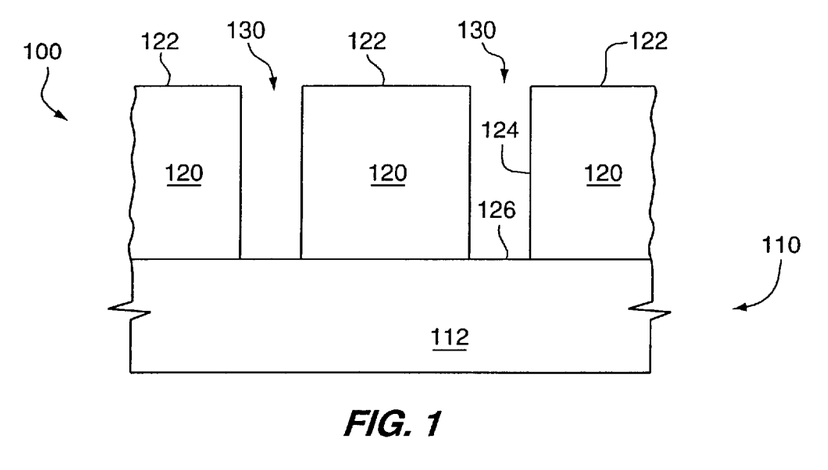
FIG. 1 is a cross-sectional view of an integrated circuit section before a method in accordance with the invention is utilized to form a carbon-containing low-dielectric constant thin film having both Si—C and Si—H bonds.

FIG. 1 is a cross-sectional view of an integrated circuit section 100 before a method and a dielectric film in accordance with the invention are utilized to form a carbon-containing low-dielectric constant silicon oxide thin film having both Si—C and Si—H bonds. Section 100 includes a wafer substrate 110 comprising circuit elements 120 and underlying substrate 112, on which circuit elements 120 are located. Circuit elements 120 may be active circuit devices, such as transistors or memory capacitors. Circuit elements 120 typically are electrically conductive metal interconnects, such as interlevel local interconnects. Underlying substrate 112 may be a semiconductor substrate containing doped regions, such as transistor source or drain regions. Underlying substrate 112 may also include a plurality of layers, such as a conventional semiconductor substrate, interlayer dielectric films, active circuit devices, and conductive interconnects. In section 100 of FIG. 1, gaps 130 have been formed to separate circuit elements 120. Wafer substrate 110 comprises surface 126, which is the bottom of gap 130, and surfaces 122 and 124, which are the exposed surfaces of circuit elements 120. To reduce crosstalk and parasitic capacitive coupling between circuit elements 120, and resulting speed degradation and power consumption, gaps 130 are filled with carbon-containing low dielectric constant material having both Si—C and Si—H bonds. Gaps 130 typically have a gap width in the range of 100 nm to 1000 nm. In current preferred fabrication processes of the integrated circuit art, gaps 130 more typically have a gap width in the range 200 nm to 600 nm. Gaps 130 typically have a gap depth less than 1000 nm. The gap aspect ratio, that is, the ratio of gap depth to gap width, is typically in the range of 1 to 6. In current preferred fabrication processes of the integrated circuit art, the aspect ratio is in the range of 2 to 3.5.

Figure 2:
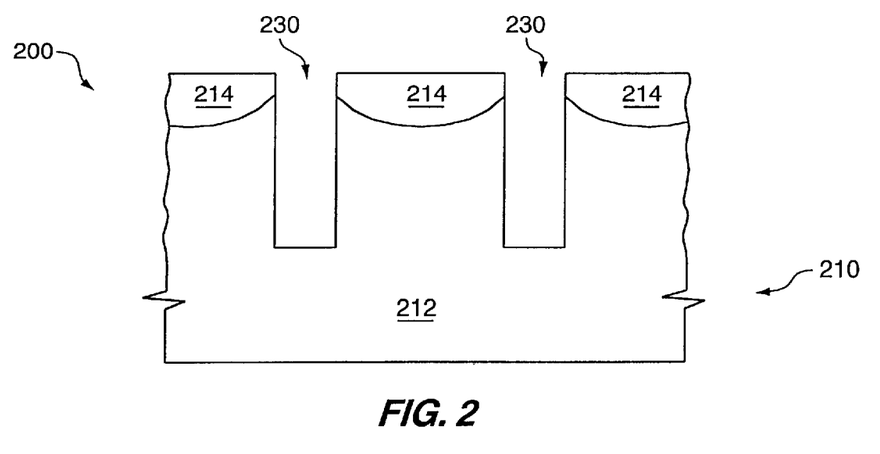
FIG. 2 depicts a cross-sectional view of an integrated circuit section before a meth in accordance with the invention is utilized to form a carbon-containing low-dielectric constant thin film having both Si—C and Si—H bonds.

FIG. 2 depicts a cross-sectional view of an integrated circuit section 200 before the method and a dielectric film in accordance with the invention are utilized to form a carbon-containing low-dielectric constant thin film having both Si—C and Si—H bonds. Section 200 includes a wafer substrate 200 comprising semiconductor substrate 212 in which circuit elements 214 have been formed. Circuit elements 214 are typically doped regions of semiconductor substrate 212, for example, source or drain regions of MOSFETs. In section 200 of FIG. 2, trenches 230 have been formed to separate circuit elements 214. To reduce cross-talk and parasitic capacitive coupling between circuit elements 214, and resulting speed degradation and power consumption, trenches 230 are filled with carbon-containing low dielectric constant material having both Si—C and Si—H bonds. Trenches 230 have a trench, or gap, width in the range of 100 nm to 1000 nm. In current preferred fabrication processes of the integrated circuit art, trenches 230 typically have a trench, or gap, width in the range of 200 nm to 600 nm. Trenches 230 typically have a depth less than 1000 nm. Trenches 230 may be referred to in this specification using the general term of "gaps", and the technique of filling the trenches 230 is generally referred to using the term "gap-filling" and related terms. The gap aspect ratio of trenches 230, that is, the ratio of trench depth to trench width, is typically in the range of 1 to 6. In current preferred fabrication processes of the integrated circuit art, the aspect ratio is in the range of 2 to 3.5.

The word "substrate" is used ambiguously in the art. It can refer to the semiconductor material on which the integrated circuit is formed, such as semiconductor substrate 212. It may also mean any object or surface on which a material layer is directly deposited. For example, in FIG. 1, circuit elements 120 are formed on underlying substrate 112, and dielectric material is deposited on surfaces 122, 124 and 126 of wafer substrate 110. In this disclosure, "substrate" shall mean the object or surface to which the layer of interest is applied. The term "semiconductor substrate" generally refers to the initial semiconductor material of the starting wafer and its doped regions, such as semiconductor substrate 212. In this specification, wafer substrates 110, 210, and specifically semiconductor substrate 212, typically comprise crystalline silicon semiconductor material; but the term "semiconductor substrate" may also refer to a GaAs, SiGe or other semiconductor materials.

Terms of orientation, such as "above", "top", "upper", "below", "bottom" and "lower" herein, mean relative to the flat direction of wafers 110, 210 in FIGS. 1, 2, 5, 6. For example, if a second element is "above" a first element, it means it is farther from substrate 112, 212. The flat dimension of substrates 112, 212 defines a substrate plane that is considered to be a "horizontal" plane herein, and directions perpendicular to this plane are considered to be "vertical". The terms "over" and "above" do not mean that a particular structure of layer is in direct contact with an underlying layer. For example, circuit element 120 might not necessarily contact the top surface of the semiconductor substrate contained in wafer 110 because there may be intervening layers and elements (not shown) in between. Similarly, the word "overlying" means that the overlying element is further from the substrate than the underlying element. It may or may not be in direct contact with an underlying layer. The term "on" is often used in the specification when referring to the deposition or formation of an integrated circuit layer onto an underlying substrate or layer. In contrast to "over" and "above", the terms "on" and "onto" generally signify direct contact, as is clear in the various contexts in which they are used. It is clear that circuit elements and carbon-containing low dielectric constant films may be fabricated with varying orientations relative to the horizontal and vertical.

The term "thin film" is used herein as it is used in the integrated circuit art. Generally, it means a film of less than a micron in thickness. The dielectric film fabricated in accordance with the invention may have a thickness of several microns, typically less than 10 microns. The invention is particularly well-suited, however, for the fabrication of dielectric thin film layers and for filling narrow gas having high aspect ratios.

2. Detailed Description of the Method and Precursors

Figure 3:
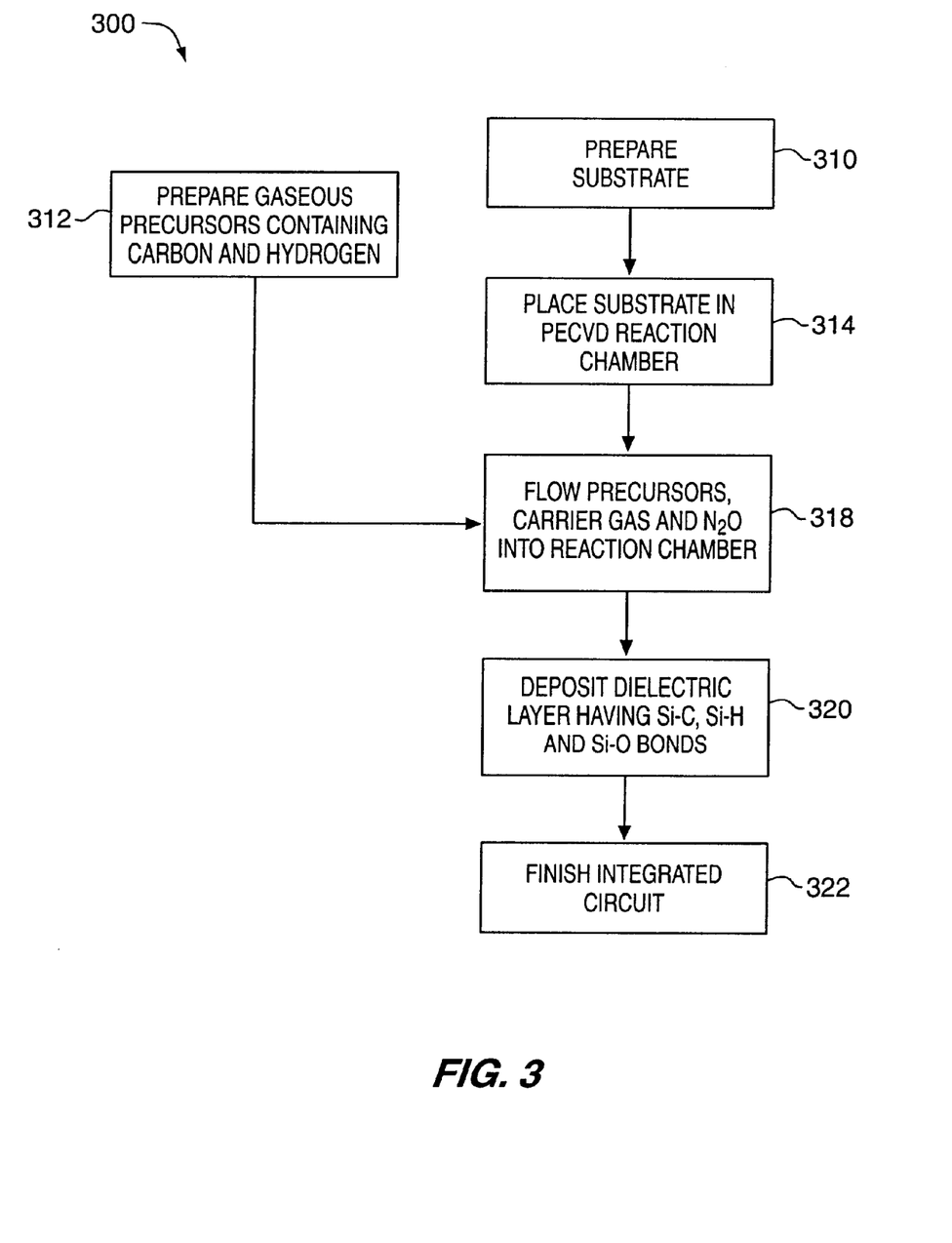
FIG. 3 is a process flow sheet of a PECVD method for forming a film of low dielectric constant, carbon-containing silicon oxide material having both Si—C and Si—H bonds.
Figure 7:
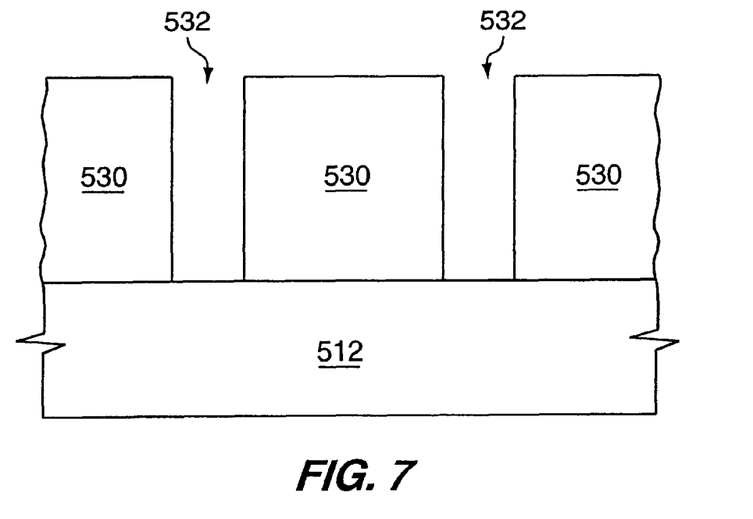
FIG. 7 is a cross-sectional view of an integrated circuit section having a blanket film deposited in a damascene process in accordance with the invention.

FIG. 3 is a process flow sheet of a preferred method 300 for forming a film of low dielectric constant, carbon-containing silicon oxide material having both Si—C and Si—H bonds. In particular, it is a flow sheet of a PECVD method in accordance with the invention. Method 300 of FIG. 3 is described with reference to FIGS. 1, 5. It should be understood, however, that a method in accordance with the invention can be modified and applied to fabricate low dielectric constant insulating films to conform to shapes other than narrow gaps of FIGS. 1, 5. For example, similar techniques may be used to fabricate interlevel dielectric layers, or a blanket film in a damascene process, as depicted in FIG. 7, in which dielectric thin film 530 is deposited on substrate 512, after which gaps 532 are formed in thin film 530.

In step 310 of FIG. 3, substrate 112 is prepared. Step 310 comprises all prior fabrication processes, including fabrication of circuit elements 120, formation of doped regions and insulating layers (not shown), and all prior annealing, patterning, etching and cleaning steps. Finally, step 310 includes formation of gaps 130 using conventional patterning and etching steps. In step 312, final gaseous precursors containing moieties of silicon atoms, hydrogen atoms and carbon atoms are prepared. The carbon atoms are typically included in organic precursor compounds, such as organo silanes, which are gaseous at ambient temperature and at the low pressure of the PECVD process. Preferably, the carbon-containing precursor compound is trimethyl silane ("3MS") or tetramethyl silane ("4MS"). The hydrogen-containing precursor compound is preferably silane, $SiH_4$.

In step 314, wafer 110 comprising substrate 112 is placed in the reaction chamber of a PECVD apparatus. PECVD apparati have been described in numerous publications, and most conventional apparati are suitable for carrying out the method of the invention. After the wafer is placed on the substrate holder, the pressure of the apparatus, in particular the reaction chamber, is maintained at a pressure in the range of from 1.0 to 5 Torr, preferably about 2.7 Torr. The temperature of the reaction chamber is maintained in the range of from 200 to 400° C., preferably 400° C. In the reaction chamber, a high-frequency RF field is applied, preferably at 13.56 MHz. The RF power is typically in a range of from 100 to 2500 watts, preferably about 900 watts.

In step 318, the gaseous precursor compounds, the inert carrier gas, and nitrous oxide, $N_2O$, are fed into the reaction chamber. In a conventional PECVD apparatus having a reaction chamber with the volume of about 165 liters, the flow rate of 3MS or 4MS is in a range of from 500 to 3000 sccm, the flow rate of $SiH_4$ is 100 to 500 sccm, the flow rate of $N_2O$ is 5000 to 10,000 sccm, and the flowrate of $N_2$ carrier gas is from 0 to 5000 sccm. In a preferred method, the flow rate of 3MS is 1000 sccm (or if 4MS is used, then its preferred flowrate is 1100 sccm); of $SiH_4$, 200 sccm; of $N_2O$, 7500 sccm; and of $N_2$, 750 sccm. The resulting reactant gas mixture flows through a showerhead fixture towards the wafer substrate. The distance between the showerhead and a standard eight-inch wafer substrate is preferably about 0.465 inches, or 1.18 cm. In step 320, therefore, dielectric film 150 is deposited containing silicon oxide ("Si—O"), silicon-carbon ("Si—C") and silicon-hydrogen ("Si—H") bonds. Under usual conditions, the deposition rate ranges from 100 nm per minute to 1000 nm per minute, and is typically about 750 nm per minute.

The integrated circuit is completed in step 322, which may include re-utilization of this invention and conventional steps of: adding dielectric films, active circuit elements, conductive interconnects; patterning, etching and annealing; and packaging.

Figure 4:
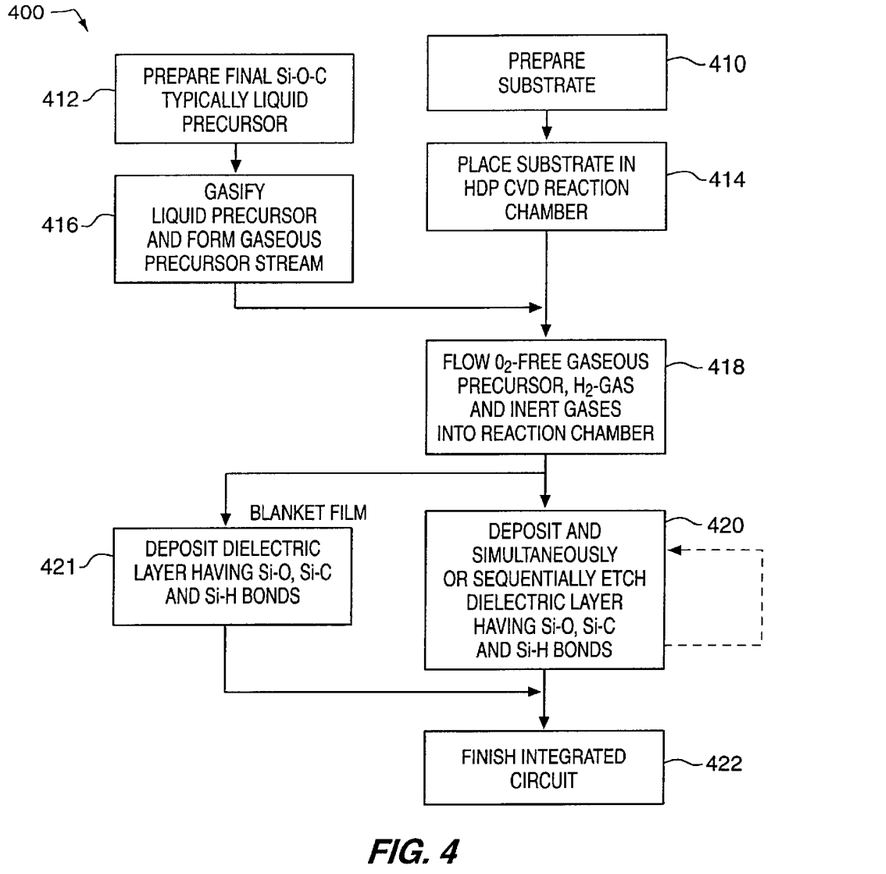
FIG. 4 is a process flow sheet of an HDP-CVD for forming a film of low dielectric constant, carbon-containing silicon oxide material having both Si—C and Si—H bonds.
Figure 5:
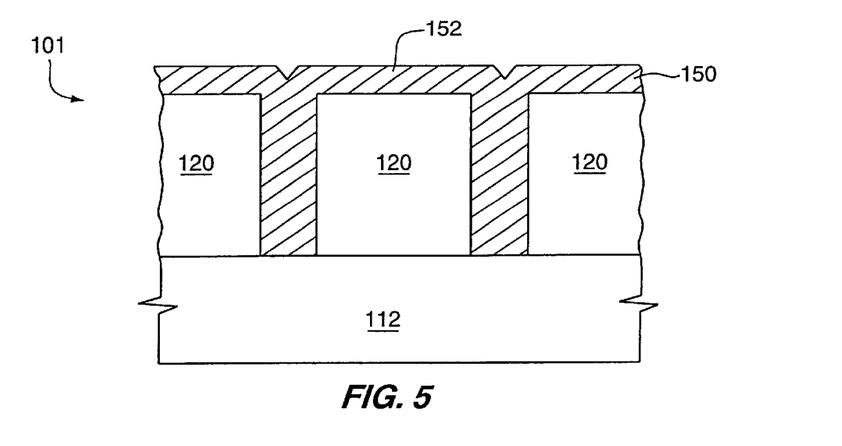
FIG. 5 shows the section of FIG. 1 in which the gaps have been filled with a dielectric film using a method in accordance with the invention.

FIG. 4 is a process flow sheet of a preferred method 400 for forming a film of low dielectric constant, carbon-containing silicon oxide material having both Si—C and Si—H bonds. In particular, it is a flow sheet of an HDP-CVD method in accordance with the invention. Method 400 of FIG. 4 is described with reference to FIGS. 2 and 6. It should be understood, however, that a method and precursors in accordance with the invention can be modified and applied to fabricate low dielectric constant insulating films to conform to shapes other than narrow gaps of FIGS. 2, 6. For example, similar techniques may be used to fabricate inter-level dielectric films, or a blanket film in a damascene process, as depicted in FIG. 7.

In step 410 of FIG. 4, substrate 212 is prepared. Step 410 comprises all prior fabrication processes, including fabrication of circuit elements 220, formation of doped regions 214 and insulating layers (not shown), and all prior annealing, patterning, etching and cleaning steps. Finally, step 410 includes formation of gaps 230 using conventional patterning and etching steps. In step 412, a final precursor, usually a liquid precursor solution, containing moieties of silicon atoms and carbon atoms is prepared. In the most preferred embodiment of a method in accordance with the invention, no reactive oxygen atoms are fed into the reaction chamber, where they could react with carbon atoms, effectively removing them from the deposited film, or react with oxygen and hydrogen, forming OH-groups or water. In a preferred process, therefore, a liquid precursor solution contains silicon, oxygen, and carbon atoms. Preferably, the silicon, oxygen and carbon atoms are all present in the same organic precursor compound. The preferred organic precursor compound is octamethylcyclotetrasiloxane, corresponding to the stoichiometric formula $(SiO(CH_3)_2)_4$. Accordingly, if the oxygen to be incorporated in the silicon oxide dielectric film is present in the liquid precursor, then addition of an oxygen-containing gas to the HDP-CVD reaction chamber may not be necessary. The organic precursor compounds may be prepared using a variety of standard conventional methods, or they may be purchased commercially.

In step 414, wafer 210 comprising substrate 212 is placed in the reaction chamber of an HDP-CVD apparatus. HDP-CVD apparati have been described in numerous publications, and most conventional apparati are suitable for carrying out the method of the invention. A preferred apparatus was described in U.S. Pat. No. 5,605,599, issued Feb. 25, 1997, to Benzing et al., which is hereby incorporated by reference as if fully contained herein. After the wafer is placed on the substrate holder, the pressure of the reaction chamber is maintained at a pressure in the range of 0.1 mTorr to 100 mTorr, preferably in the range of 5 mTorr to 15 mTorr. The temperature of the reaction chamber is maintained in the range of 0° C. to 200° C., preferably at 50° C. Argon or other plasma-forming gas is added to the reaction chamber at a flowrate in the range of 5 sccm to 100 sccm, preferably about 10 sccm. In the reaction chamber, a low frequency ("LF") rf field is applied, thereby forming a plasma. The argon serves to maintain plasma energy.

In step 416, the liquid precursor is gasified into an inert carrier gas, typically helium. Gasification may be achieved using one or a combination of several conventional techniques, including bubbling, ultrasound, misting and heating. The gasification occurs at low pressure, corresponding to the pressure of the reaction chamber, thereby making gasification easier. The preferred method of gasification is evaporation of the precursor at reactor chamber pressure. The flow rate of liquid precursor to the gasifying stage is in the range of 0.1 ml/min to 1.5 ml/min, preferably about 0.75 ml/min. The flow rate of inert carrier gas is in the range of 50 sccm to 1000 sccm, preferably about 150 sccm. A volatile precursor compound, gaseous at room temperature and low pressure, may also be used in a method in accordance with the invention, in which case no gasification step 416 is necessary.

In step 418, a hydrogenating gas, preferably hydrogen gas ("$H_2$-gas"), and the gaseous precursor stream, preferably oxidizer-free, are fed into the reaction chamber. The gaseous precursor stream and other gases added to the reactor form the reactant gas mixture. The hydrogen gas has a flowrate in a range of from 10 to 500 sccm.

The LF source has a frequency typically in the range of from 200 kHz to 1000 kHz, preferably about 450 kHz, and a power in the operating range of 200 watts to 1000 watts, preferably about 500 watts. Further, a high frequency ("HF") rf source is connected to the wafer holder. The HF source has a frequency typically in the range of from 8 MHz to 20 MHz, preferably about 13.56 MHz, and a power in the operating range of about 500 watts to 1500 watts. Preferably, the HF rf source has an internal dc bias control that allows a regulated bias voltage at the wafer to be achieved. The HF power and bias are determined by desired film properties.

In step 420, the LF rf field is applied to the reactant gas mixture and the resulting plasma, while the HF rf power is applied to the wafer holder. The plasma causes the organic precursor compound to dissociate into reactive radicals that react at the substrate surface, resulting in deposition of dielectric film 250 containing silicon oxide ("Si—O"), silicon-carbon ("Si—C") and silicon-hydrogen ("Si—H") bonds.

In an embodiment in accordance with the invention in which a blanket film is deposited (damascene process), step 420 is not followed. Instead, in alternate step 421, a blanket film 530 is deposited using little or no sputtering by HF rf bias.

Preferably, the HF rf bias is varied when depositing a gap-filling silicon oxide film 250 having both Si—C and Si—H bonds. Preferably, it is varied by applying it pulse-wise to the wafer. The length of time the bias is switched on and the length of time it is switched off can be controlled to accomplish just enough sputtering to keep gap opening 132 open. The on and off times are determined by the maximum thickness that can be deposited without causing the gap to begin to close. Once the maximum thickness is reached, the bias is switched on, and the corners of the gap at the facet surfaces are preferentially sputtered. The deposition rate of the dielectric material and its sputtering rate, the bias pulse on and off times, and the pulse magnitude are all interrelated and need to be optimized for each gap geometry, reactor type and desired material properties. The pulse shape can be constant throughout the deposition process, or it can be varied. The rf bias may be continuous and uniform initially, and then the pulsed bias may be started after some material has already deposited; or the bias may be applied pulse-wise at the beginning of the plasma deposition process. A pulse trigger device may be used to control the bias source. For filling a gap with a 0.24 μm opening width and an aspect ratio of 2.5 using the operating conditions described above, the bias pulse is switched off for about 2 seconds to 5 seconds during plasma deposition. Then, during a pause of about 5 seconds, the precursor compound gases are cleared from the system, while an inert sputter gas, usually argon, is flowed into the chamber. The HF rf bias is switched on for about 40 seconds to sputter the film. Then the cycle is repeated until the gap is filled and the desired film thickness is achieved.

Alternatively, the HF rf bias may be varied by tailoring the magnitude of the bias. Preferably, the magnitude of the bias is decreased from about 5 kW to about zero kW during the course of the deposition process. As the gap is filled, the power of the bias is decreased. Preferably, both techniques, that is, bias pulsing and bias tailoring, are used to minimize sputtering of the wafer substrate surface.

Figure 6:
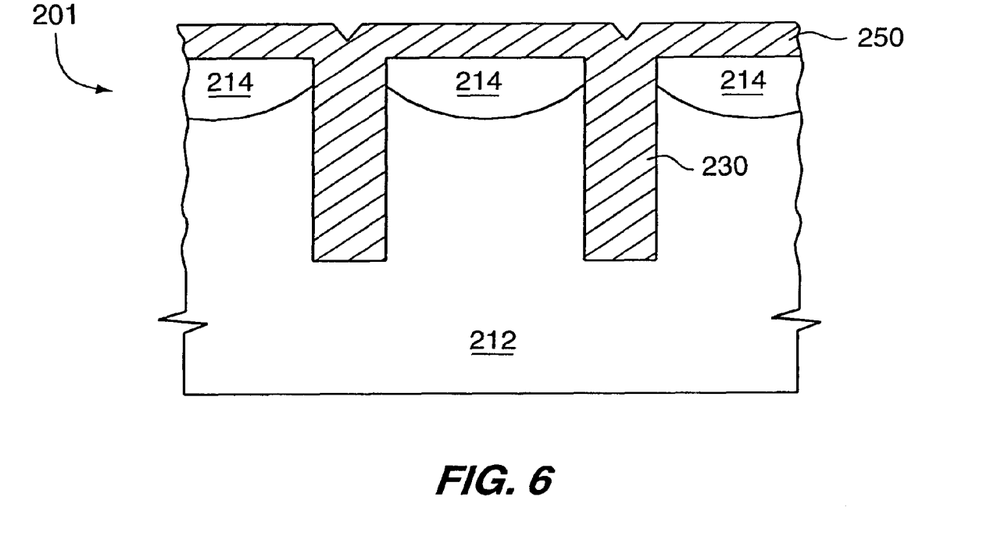
FIG. 6 shows the section of FIG. 2 in which the gaps have been filled with a dielectric film using a method in accordance with the invention.

FIG. 6 depicts a section 201, which is a later stage of section 200 of FIG. 2, in which the invention was applied to deposit film 250 and fill trenches, or gaps, 230 in semiconductor substrate 212.

The integrated circuit is completed in step 422, which may include re-utilization of this invention and conventional steps of: adding dielectric layers, active circuit elements, conductive interconnects; patterning, etching and annealing; and packaging.

FIG. 7 is a cross-sectional view of an integrated circuit section 500 having a blanket film 530 deposited in a damascene process in accordance with the invention. Section 500 comprises a substrate 512 on which a film of low dielectric constant, carbon-containing silicon oxide material having both Si—C and Si—H bonds is deposited in accordance with the invention. Because it is not necessary to fill gaps, blanket film 530 is deposited using a PECVD or HDP-CVD method in accordance with the invention in which there is little sputter etching of the dielectric material during deposition. Blanket film 530 then is typically patterned and etched, to form gaps 532, which are then typically filled with a conductive interconnect material. When a method in accordance with the invention is used to deposit a blanket film or other non-gap-filling thin film, then the HF rf bias of step 420 may be eliminated entirely.

EXAMPLE 1

A carbon-containing silicon oxide dielectric film having both Si—C and Si—H bonds was formed using a PECVD process in accordance with the invention.

The deposition process was performed at 400° C. and 2.7 Torr pressure, with 900 watts high-frequency rf at 13.6 MHz. The flow rate of reactant gases into the PECVD reaction chamber was: $SiH_4$, 200 sccm; 4MS, 1100 sccm; $N_2O$, 7500 sccm; and $N_2$, 750 sccm.

The deposition rate was approximately 710 nm/min. The "within wafer non-uniformity" was 1.1 percent, 1 σ, with 3 mm edge exclusion. The "wafer-to-wafer non-uniformity" was 0.9 percent, 1 σ. The dielectric constant measured at 1 MHz was 2.85.

For comparison, a silicon oxide film containing carbon was fabricated using a conventional process. The deposition was performed at 400° C. and 3.0 Torr pressure. The rf power was set at a conventional level of 1500 watts. No silane gas, $SiH_4$, was used. The flow rate of reactant gases into the PECVD reaction chamber was: 4MS, 700 sccm; $N_2O$, 1300 sccm; and $N_2$, 250 sccm.

Even though the rf power was much higher in the conventional process than in the exemplary method in accordance with the invention, the deposition rate in the conventional-type process was much slower, and the film non-uniformity was greater. The resulting deposition rate was approximately 550 nm/min, considerably less than 710 nm/min achieved using the method in accordance with the invention. The "within wafer non-uniformity" was 2.0 percent, 1 σ, with 3 mm edge exclusion. The "wafer-to-wafer non-uniformity" was 2.8 percent, 1 σ. The dielectric constant measured at 1 MHz was 2.70.

The dielectric constant of the exemplary dielectric film made in accordance with the invention was less than 3 and comparable to that of the dielectric film made under conventional conditions. The deposition rate of the exemplary film was, however, significantly greater than that of the conventional layer. In addition, the measured uniformity values of the film made in accordance with the invention indicates a major improvement over the corresponding values of the conventional dielectric layer. Thus, the use in the example of $SiH_4$ in accordance with the invention allowed the use of more $N_2O$, resulting in a higher deposition rate and increased uniformity, without dramatically affecting the dielectric constant.

There has been described a novel method for fabricating carbon-containing low dielectric constant silicon oxide films having both Si—C and Si—H bonds for use in integrated circuits. A method in accordance with the invention, in which the reactant gas in a PECVD or HDP-CVD process contains carbon and hydrogen atoms, enables faster deposition rates and higher thin-film uniformity while achieving a low dielectric constant. It should be understood that the particular embodiments shown in the drawings and described within this specification are for purposes of example and should not be construed to limit the invention, which will be described in the claims below. For example, the invention contemplates that the precursor compounds and precursor solutions used in accordance with the invention may comprise a wide range of different types of compounds that can be dissociated and deposited using CVD techniques. Similarly, the carbon-containing silicon oxide films having both Si—C and Si—H bonds may comprise materials of various compositions and thicknesses. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Consequently, the invention is to be construed as embracing each and every novel feature and novel combination of features present in and/or possessed by the fabrication methods and compositions described.

What is claimed is:

1. A plasma-assisted method for forming a dielectric film having Si—O, Si—C and Si—H bonds on a substrate, comprising steps of:
flowing a gaseous carbon-containing organosilicon precursor compound having a Si—C bond into a reaction chamber;
flowing a gaseous hydrogen-containing precursor compound into said reaction chamber, said hydrogen-containing precursor compound comprising a Si—H bond and said hydrogen-containing precursor compound not comprising a carbon atom;
flowing a gaseous oxidizer that is not $H_2O_2$ into said reaction chamber;
flowing a plasma-forming gas into said reaction chamber; and
forming a plasma with said plasma-forming gas.

2. A method as in claim 1 wherein said gaseous oxidizer is nitrous oxide, having. stoichiometric formula $N_2O$.

3. A method as in claim 1 wherein said hydrogen-containing compound is silane, having a stoichiometric formula $SiH_4$.

4. A method as in claim 1 wherein said carbon-containing organosilicon precursor compound is an alkyl silane.

5. A method as in claim 4 wherein said alkyl silane is selected from the group consisting of trimethyl silane and tetramethyl silane.

6. A method as in claim 1 wherein said reaction chamber comprises $SiH_4$ and an alkyl silane.

7. A method as in claim 1 wherein forming a plasma comprises applying a high-frequency radio-frequency field to said plasma-forming gas.

8. A method as in claim 7 wherein said radio-frequency field as a frequency of about 13.56 MHz.

9. A method as in claim 7 wherein applying a high-frequency radio-frequency field to said plasma-forming gas comprises applying RF power in a range of about from 100 to 2500 watts.

10. A method as in claim 1 further comprising steps of maintaining pressure in said reaction chamber in a range of about from 1 to 5 Torr.

11. A method as in claim 1 further comprising steps of maintaining a temperature of said reaction chamber in a range of about from 200° to 400° C.

12. A method as in claim 11 wherein said reaction chamber is included in a PECVD apparatus.

13. A method as in claim 1 wherein forming a plasma comprises applying a low-frequency radio-frequency field to said plasma-forming gas and applying a high-frequency radio-frequency bias to said substrate.

14. A method as in claim 1 wherein said reaction chamber is included in a HDP-CVD apparatus.

15. A plasma-assisted method for forming a dielectric film having Si—O, Si—C and Si—H bonds on a substrate, comprising steps of:
flowing a gaseous oxidizer-free precursor stream into a reaction chamber, said oxidizer-free gaseous precursor stream including a non-oxidizing precursor compound comprising an Si—C bond and a non-oxidizing precursor compound comprising an Si—O bond;
flowing a gaseous oxidizer-free stream comprising a hydrogenating gas into said reaction chamber;
flowing an inert plasma-forming gas into said reaction chamber; and
forming a plasma with said plasma-forming gas,
wherein said reaction chamber substantially free of reactive oxygen.

16. A method as in claim 15 wherein said hydrogenating gas is hydrogen-gas, $H_2$.

17. A method as in claim 15 wherein said precursor compound comprising a Si—C bond contains an alkyl group.

18. A method as in claim 15 wherein a precursor compound comprises a Si—C bond and a Si—O bond.

19. A method as in claim 18 wherein said precursor compound is octamethylcyclotetrasiloxane, corresponding to the stoichiometric formula $(SiO(CH_3)_2)_4$.

20. A method as in claim 15 wherein said reaction chamber comprises an inert gas.

21. A method as in claim 15 wherein forming a plasma comprises applying a low-frequency radio-frequency field to said plasma-forming gas.

22. A method as in claim 21 wherein said radio-frequency field has a frequency in a range of about from 200 kHz to 1000 kHz.

23. A method as in claim 21 wherein applying a low-frequency radio-frequency field to said plasma-forming gas comprises applying RF power in a range of about from 200 to 1000 watts.

24. A method as in claim 21 further comprising steps of applying a high-frequency radio-frequency bias to said substrate.

25. A method as in claim 24 wherein said applying a high-frequency radio-frequency bias comprises applying/a bias voltage having a frequency in a range of about from 8 MHz to 20 MHz.

26. A method as in claim 25 wherein said applying a bias voltage comprises apple, power in a range of about from 500 watts to 1500 watts.

27. A method as in claim 24 wherein said applying a high-frequency bias comprises applying a high-frequency bias pulse-wise to said substrate.

28. A method as in claim 24 herein said applying a high-frequency bias comprises tailoring a magnitude of said high-frequency bias.

29. A method as in claim 28 wherein said tailoring a magnitude of said high-frequency bias comprises decreasing said magnitude from about 5 kW to about 0 kW.

30. A method as in claim 15 further comprising steps of maintaining pressure in said reaction chamber in a range of about from 0.1 mTorr to 100 mTorr.

31. A method as in claim 30 further comprising steps of maintaining pressure in said reaction chamber in a range of about from 5 mTorr to 15 mTorr.

32. A method as in 15 claim further comprising steps of maintaining a temperature of said reaction chamber in a range of about from 0 to 200° C.

33. A method as in claim 32 further comprising steps of maintaining a temperature of said reaction chamber about 50° C.

34. A method as in claim 15 wherein said reaction chamber is included in a HDP-CVD apparatus.

35. A method as in claim 15 wherein forming a plasma comprises applying a high-frequency radio-frequency field to said plasma-forming gas.

36. A method as in claim 15 wherein said reaction chamber is included in a PECVD apparatus.

37. A dielectric film, having Si—O, Si—C and Si—H bonds, fabricated by:

flowing a gaseous carbon-containing organosilicon precursor compound having a Si—C bond into a reaction chamber;

flowing a gaseous hydrogen-containing precursor compound into said reaction chamber, said hydrogen-containing precursor compound comprising a Si—H bond and said hydrogen-containing precursor compound not comprising a carbon atom;

flowing a gaseous oxidizer that is not $H_2O_2$ into said reaction chamber;

flowing a plasma-forming gas into said reaction chamber; and forming a plasma with said plasma-forming gas.

38. A method as in claim 37 wherein said gaseous oxidizer is nitrous oxide, having a stoichiometric formula $N_2O$.

39. A dielectric film as in claim 37 wherein said hydrogen-containing compound comprises silane, having a stoichiometric formula $SiH_4$.

40. A dielectric film as in claim 37 wherein said carbon-containing organosilicon precursor compound is an alkyl silane.

41. A dielectric film as in claim 40 wherein said alkyl silane is selected from the grow consisting of trimethyl silane and tetramethyl silane.

42. A dielectric film as in claim 37 wherein said reaction chamber comprises $SiH_4$ and an alkyl silane.

43. A dielectric film as in claim 37 wherein forming a plasma comprises applying f high-frequency radio-frequency field to said plasma-forming gas.

44. A dielectric film as in claim 43 wherein said radio-frequency field as a frequency of about 13.56 MHz.

45. A dielectric film as in claim 43 wherein applying a high-frequency radio-frequency field to said plasma-forming gas comprises applying RF power in a range of about from 100 to 2500 watts.

46. A dielectric film as in claim 37 further comprising steps of maintaining pressure in said reaction chamber in a range of about from 1 to 5 Torr.

47. A dielectric film as in claim 37 further comprising steps of maintaining a temperature of said reaction chamber in a range of about from 200° to 400° C.

48. A dielectric film as in claim 37 wherein said reaction chamber is included in a PECVD apparatus.

49. A method as in claim 37 wherein forming a plasma comprises applying a low-frequency radio-frequency field to, said plasma-forming gas and applying a high-frequency radio-frequency bias to said substrate.

50. A method as in claim 37 wherein said reaction chamber is included in a HDP-CVD apparatus.

51. A dielectric film, having Si—O, Si—C and Si—H bonds, fabricated by:

flowing a gaseous oxidizer-free precursor stream into a reaction chamber, said oxidizer-free gaseous precursor stream including a non-oxidizing precursor compound comprising an Si—C bond and a non-oxidizing precursor compound comprising an Si—O bond;

flowing a gaseous oxidizer-free stream comprising a hydrogenating gas into said reaction chamber;

flowing an inert plasma-forming gas into said reaction chamber; and forming a plasma with said plasma-forming gas, wherein said reaction chamber is substantially free of reactive oxygen.

52. A dielectric film as in claim 51 wherein said hydrogenating gas comprises hydrogen-gas, $H_2$.

53. A dielectric film as in claim 51 wherein said precursor compound comprising a Si—C bond contains an alkyl group.

54. A dielectric film as in claim 51 wherein a precursor compound comprises a Si—C bond and a Si—O bond.

55. A dielectric film as in claim 51 wherein said gaseous precursor stream comprises octamethylcyclotetrasiloxane, corresponding to the stoichiometric formula $(SiO(CH_3)_2)_4$.

56. A dielectric film as in claim 51 wherein said reaction chamber comprises an inert gas.

57. A dielectric film as in claim 51 wherein forming a plasma comprises applying a low-frequency radio-frequency field to said plasma-forming gas.

58. A dielectric film as in claim 57 wherein said radio-frequency field has a frequency in a range of about from 200 kHz to 4000 kHz.

59. A dielectric film as in claim 57 wherein applying a low-frequency radio-frequency field to said plasma-forming gas comprises applying RF power in a range of about from 200 to 1000 watts.

60. A dielectric film as in claim 51 further comprising steps of applying a high-frequency radio-frequency bias to a substrate.

61. A dielectric film as in claim 60 wherein said applying a high-frequency radio-frequency bias comprises applying a bias voltage having a frequency in a range of about from 8 MHz to 20 MHz.

62. A dielectric film as in claim 61 wherein said applying a bias voltage comprises applying power in a range of about from 500 watts to 1500 watts.

63. A dielectric film as in claim 60 wherein said applying a high-frequency bias comprises applying a high-frequency bias pulse-wise to said substrate.

64. A dielectric film as in claim 60 wherein said applying a high-frequency bias comprises tailoring a magnitude of said high-frequency bias.

65. A dielectric film as in claim 64 wherein said tailoring a magnitude of said high-frequency bias comprises decreasing said magnitude from about 5 kW to about 0 kW.

66. A dielectric film as in claim 51 further comprising steps of maintaining pressure in said reaction chamber in a range of about from 0.1 mTorr to 100 mTorr.

67. A dielectric film as in claim 66 further comprising steps of maintaining pressure in said reaction chamber in a range of about from 5 mTorr to 15 mTorr.

68. A dielectric film as in claim 51 further comprising steps of maintaining a temperature of said reaction chamber in a range about from 0° to 200° C.

69. A dielectric film as in claim 68 further comprising steps of maintaining a temperature of said reaction chamber at about 50° C.

70. A dielectric film as in claim 51 wherein said reaction chamber is includes in a HDP-CVD apparatus.

71. A method as in claim 51 wherein forming a plasma comprises applying a high-frequency radio-frequency field to said plasma-forming gas.

72. A method as in claim 51 wherein said reaction chamber is included in a apparatus.

* * * * *